(12) United States Patent
Bellino et al.

(10) Patent No.: US 8,887,662 B2
(45) Date of Patent: Nov. 18, 2014

(54) PRESSURE MASKING SYSTEMS AND METHODS FOR USING THE SAME

(75) Inventors: Mark Carmine Bellino, Greenville, SC (US); Matthew Paul Berkebile, Mauldin, SC (US); Eunice Delia Reyes, Weslaco, TX (US)

(73) Assignee: General Electric Company, Schenectady, NY (US)

( * ) Notice: Subject to any disclaimer, the term of this patent is extended or adjusted under 35 U.S.C. 154(b) by 101 days.

(21) Appl. No.: 13/339,449

(22) Filed: Dec. 29, 2011

(65) Prior Publication Data

US 2013/0171353 A1 Jul. 4, 2013

(51) Int. Cl.
*B05C 21/00* (2006.01)
*B05D 1/32* (2006.01)
*B05D 3/10* (2006.01)
*C23C 14/04* (2006.01)
*B05B 15/04* (2006.01)
*B05D 3/04* (2006.01)

(52) U.S. Cl.
CPC ............. *B05C 21/005* (2013.01); *C23C 14/046* (2013.01); *B05D 1/32* (2013.01); *B05B 15/0431* (2013.01); *B23P 2700/06* (2013.01); *B05D 3/042* (2013.01); *B05B 15/045* (2013.01)
USPC .......................................... 118/505; 118/504

(58) Field of Classification Search
None
See application file for complete search history.

(56) References Cited

U.S. PATENT DOCUMENTS

| | | | |
|---|---|---|---|
| 6,365,013 B1 | 4/2002 | Beele | |
| 6,878,046 B2 | 4/2005 | Publ et al. | |
| 7,192,622 B2 | 3/2007 | Fernihough et al. | |
| 7,622,160 B2 | 11/2009 | Gupta et al. | |
| 7,805,822 B2 | 10/2010 | Hanley | |
| 8,021,719 B2 | 9/2011 | Graichen | |
| 2009/0226626 A1* | 9/2009 | Gupta et al. | 427/448 |
| 2012/0087802 A1 | 4/2012 | von Niessen et al. | |
| 2012/0261074 A1* | 10/2012 | Wang | 156/367 |

* cited by examiner

*Primary Examiner* — Dah-Wei D Yuan
*Assistant Examiner* — Jethro M Pence
(74) *Attorney, Agent, or Firm* — Blake A. Nickles; Ernest G. Cusick; Frank A. Landgraff

(57) ABSTRACT

Methods of pressure coating a target surface of an article comprising one or more passageways include fluidly connecting a pressure masker comprising pressurized masking fluid to a first side of at least one passageway, passing the pressurized masking fluid through the at least one passageway from the first side to a second side comprising the target surface, and, coating the target surface using a coating material, wherein the pressurized masking fluid passing through the at least one passageway prevents the coating material from permanently altering a cross sectional area of the at least one passageway.

9 Claims, 4 Drawing Sheets

PRESSURE MASKING SYSTEMS AND METHODS FOR USING THE SAME

BACKGROUND OF THE INVENTION

The subject matter disclosed herein relates to masking systems and, more specifically, to pressure masking systems for coating articles with passageways.

In gas turbine engines, such as aircraft engines for example, air is drawn into the front of the engine, compressed by a shaft-mounted rotary-type compressor, and mixed with fuel. The mixture is burned, and the hot exhaust gases are passed through a turbine mounted on a shaft. The flow of gas turns the turbine, which turns the shaft and drives the compressor and fan. The hot exhaust gases flow from the back of the engine, driving it and the aircraft forward.

During operation of gas turbine engines, the temperatures of combustion gases may exceed 3,000° F., considerably higher than the melting temperatures of the metal parts of the engine which are in contact with these gases. Operation of these engines at gas temperatures that are above the metal part melting temperatures is a well-established art, and depends in part on supplying a cooling air to the outer surfaces of the metal parts through various methods. The metal parts of these engines that are particularly subject to high temperatures, and thus require particular attention with respect to cooling, are the metal parts forming combustors and parts located aft of the combustor.

The metal temperatures can be maintained below melting levels by using passageways such as cooling holes incorporated into some engine components. Sometimes, thermal barrier coatings (TBCs) may also be applied to the component by a pressure coating process (e.g., a thermal spray process). However, the thermal spray process and other cleaning processes (e.g., grit blasting, shot peening, water jet washing) often results in overspray that partially or completely blocks the component's cooling holes.

As a result, present coating and cleaning processes involve a multi-step, highly labor intensive process of applying a partial layer of TBC coating, allowing the component and the TBC to sufficiently cool to a temperature at which the component can easily be handled, removing the component from an application fixture on which the thermal spraying takes place, and removing any masking, which is then followed by separately removing the well-cooled, solidified coating from the cooling holes using a water jet or other cleaning methods. To prevent the cooling holes from becoming obstructed beyond a level from which they can be satisfactorily cleaned, only a fraction of the desired TBC thickness is applied prior to cleaning. As a result, the entire process must typically be repeated several times until the desired TBC thickness is reached. This complex process results in low productivity, high cycle time, and increases costs by a factor of five to ten times that of applying the same TBC to a similar non-holed part. Even when coatings are not applied, the pressure cleaning methods used to clean the target surfaces of articles can similarly overflow and obstruct the article's cooling holes.

Accordingly, alternative pressure masking systems would be welcomed in the art.

BRIEF DESCRIPTION OF THE INVENTION

In one embodiment, a method of pressure coating a target surface of an article comprising one or more passageways is disclosed. The method includes fluidly connecting a pressure masker comprising pressurized masking fluid to a first side of at least one passageway, passing the pressurized masking fluid through the at least one passageway from the first side to a second side comprising the target surface, and, coating the target surface using a coating material, wherein the pressurized masking fluid passing through the at least one passageway prevents the coating material from permanently altering a cross sectional area of the at least one passageway.

In another embodiment, a pressurized masking system for coating a target surface of an article comprising passageways is disclosed. The pressurized masking system includes a pressure masker that fluidly connects to a first side of at least one passageway of the article and passes a pressurized masking fluid through the passageway from the first side to a second side, wherein the second side comprises the target surface. The pressurized masking system further includes a part coater that projects a coating material towards the target surface, wherein the pressurized masking fluid prevents the coating material from permanently altering a cross sectional area of the at least one passageway.

These and additional features provided by the embodiments discussed herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Pressurized masking systems disclosed herein generally comprise a pressure masker and a part coater to coat the target surface of an article comprising passageways. While the part coater projects coating material towards the target surface, pressurized masking fluid is fluidly connected to the passageways and passed there through to prevent the permanent altering a cross sectional area of the passageway of the passageways by the coating material. Pressurized masking systems, and methods of pressure coating a target surface of an article will be discussed in more detail herein.

Figure 1:
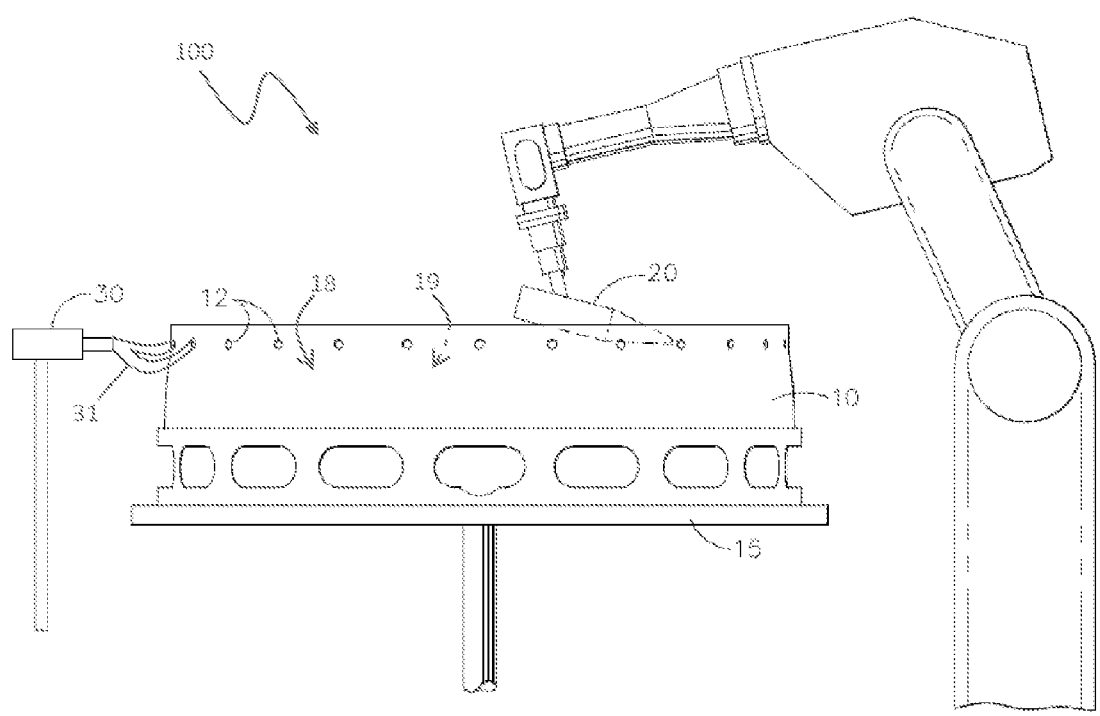
FIG. 1 is a schematic illustrated of a pressure masking system according to one or more embodiments shown or described herein.
Figure 2:
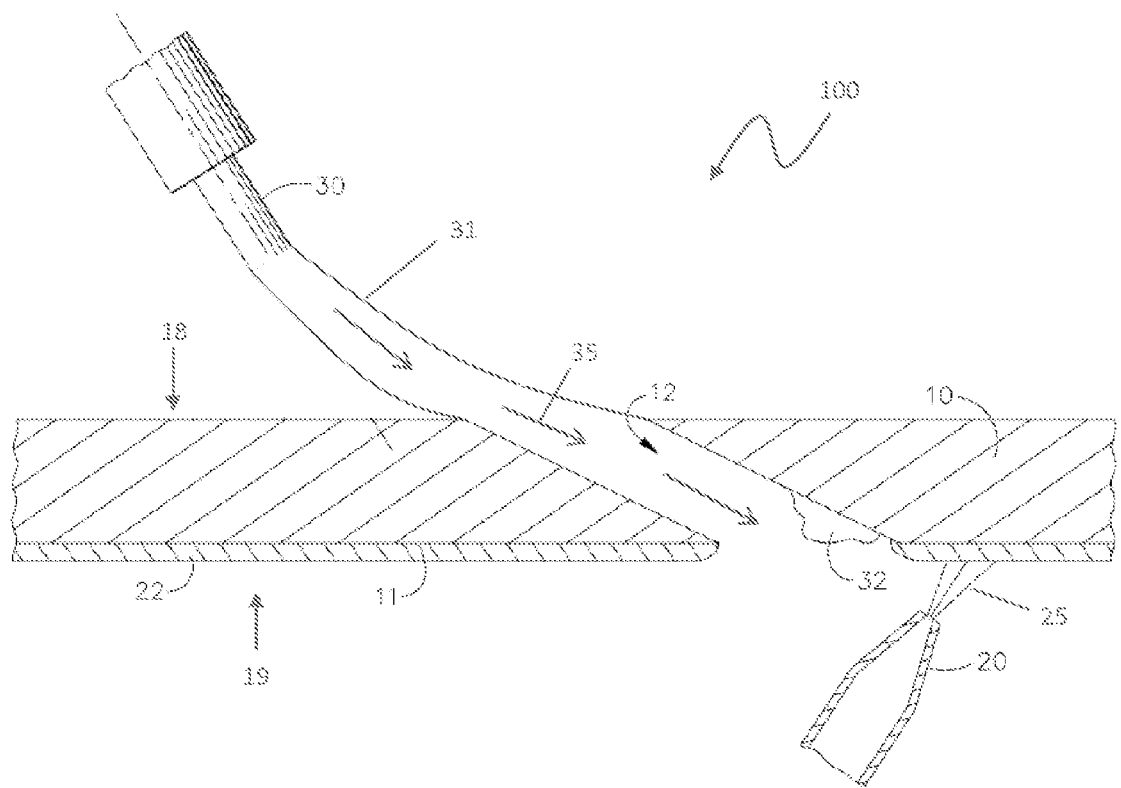
FIG. 2 is a perspective view of a pressure masking system according to one or more embodiments shown or described herein.
Figure 3:
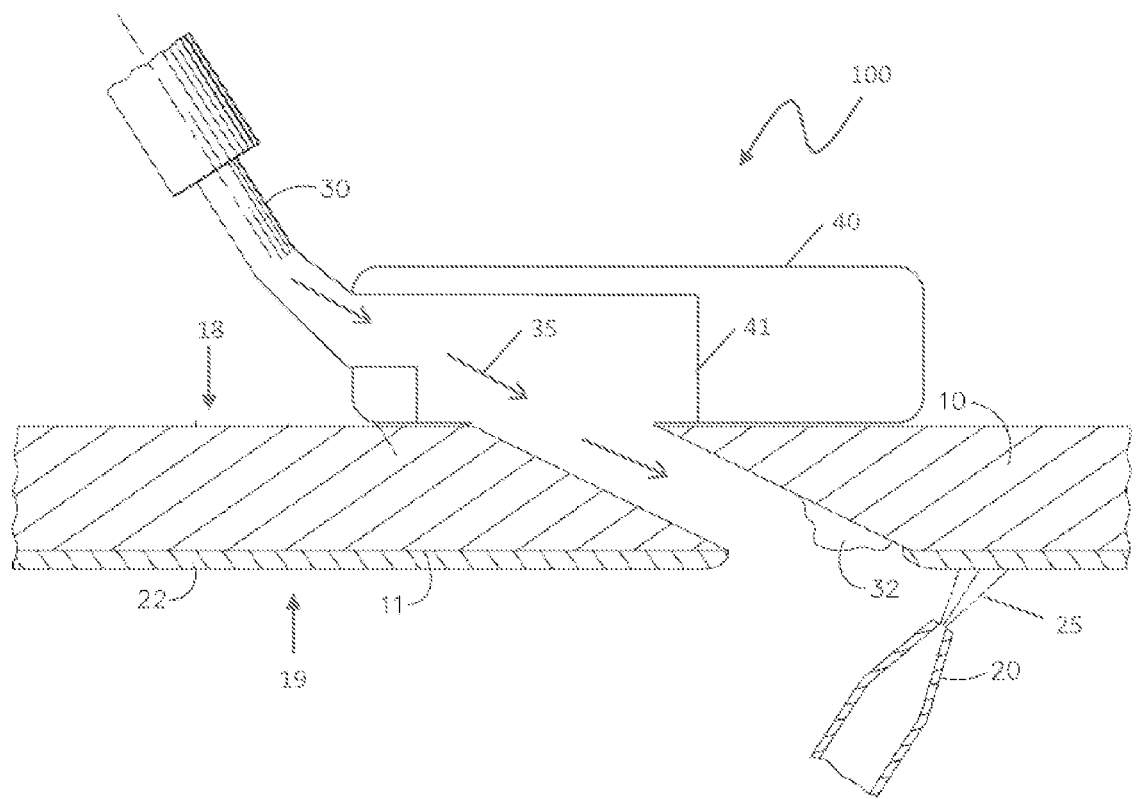
FIG. 3 is a perspective view of another pressure masking system according to one or more embodiments shown or described herein; and, FIG. 4 is a method of pressure coating an article using a pressure masking system according to one or more embodiments shown or described herein.
Figure 4:
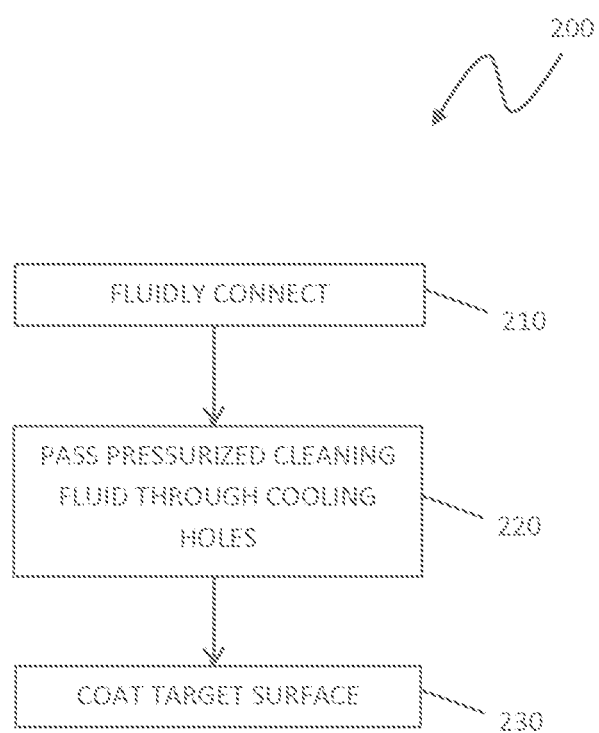

Referring now to FIGS. 1-3, a pressurized masking system 100 is illustrated comprising a part coater 20 and a pressure masker 30 for coating an article 10. The article 10 comprises one or more passageways 12 passing through the article 10 from a first side 18 to a second side 19. As discussed above, the article 10 can comprise a variety of different parts such as a combustor liner or other component of a gas turbine engine. In some embodiments, the article 10 can comprise a turbine component such as a hot gas path component or a combustion component. The passageways 12 can comprise any passage through the article 10 (passing from the first side 18 to the second side 19) that is intended to remain open (such that air can pass through) when the article 10 is in use. For example, in some embodiments the passageways 12 may comprise cooling holes.

As best illustrated in FIGS. 2-3, the second side 19 of the article 10 comprises a target surface 11 that is to be coated with a coating 22. The target surface 11 may be coated prior to first use, during routine or repair maintenance, or as otherwise necessary depending on the life of the article 10. As used herein, "coated" refers to at least partially applying a new material to a surface such as through the use of a thermal spray gun or the like as will become appreciated herein.

In some embodiments, such as when the article 10 comprises a metal hot gas path component, the target surface 11 of the article 10 may have a thermal barrier coating ("TBC") coated thereon prior to operation. The TBC can comprise one or more layers of metal and/or ceramic coating material applied to the target surface 11 of the article 10 to impede the transfer of heat from hot combustion gases to the article 10, thus insulating the component from the hot combustion gas. The presence of the TBC on the surface permits the combustion gas to be hotter than would otherwise be possible with the particular material and fabrication process of the component. Any suitable composition of TBC may be applied. For example, in some embodiments the TBC can comprise a bond layer of MCrAlY, wherein M is preferably Ni, Co, or a combination thereof, followed by a layer of yttria stabilized zirconia (YSZ).

In some embodiments, the article 10 may be disposed on a support stand 15 prior to or during the pressure coating as will become appreciated herein. The support stand 15 may be stationary or mobile (e.g., rotatable) and position the article 10 relative to the part coater 20 and the pressure masker 30 when coating the target surface 11 of the article 10.

Still referring to FIGS. 1-3, the pressurized masking system 100 further comprises the part coater 20. The part coater 20 comprises any device that projects a coating material 25 towards the target surface 11 of the article 10. For example, in some embodiments, the part coater 20 can comprise a thermal spray gun. In such embodiments, the pressurized cleaning material 25 can comprise pressurized gas or a pressurized liquid (e.g., as water). In other embodiments, the part coater 20 can comprise any other device that projects coating material 25 towards the target surface 11 of the article 10.

The part coater 20 may be disposed at any position relative to the article 10 that allows for the coating of the target surface 11. For example, as illustrated in FIG. 1, in some embodiments the article 10 may be disposed on a support stand 15 adjacent the part coater 20. The support stand 15 may then be able to rotate or otherwise displace the article 10 with respect to the part coater 20 and/or the part coater 20 may be able to articulate with respect to the article 10. The part coater 20 may then be used to project the coating material 25 towards the target surface 11 of the article 10. However, as a result of coating material 25 being projected toward the target surface 11 of the article 10, some of the coating material 25 may enter one or more of the passageways 12 from the second side 19 of the article 10. As such, some of the coating material 25 may potentially form obstructions 32 in the one or more passageways 12 if left unopposed.

The part coater 20 may be used for a variety of applications to coat the target surface 11 of the article 10. For example in some embodiments the part coater 20 may be used to coat the target surface with a TBC as discussed above. In some embodiments, the part coater 20 may be used to apply a bond coat to the target surface 11 for the subsequent application of a TBC or other coating. In some embodiments, the part coater 20 may be used to apply a paint coat to the target surface 11. In some embodiments, the part coater 20 may be used to apply other coatings such as diffusion coatings, DVC TBC, HVOF or other adhesive boding coatings. While specific embodiments have been presented herein, it should be appreciated that these are exemplary only and any other application of the part coater 20 as part of the pressurized masking system 100 may also be realized.

Referring still to FIGS. 1-3, the pressurized masking system 100 further comprises a pressure masker 30. The pressure masker 30 comprises a fluid connection 31 that fluidly connects a source of masking fluid 35 to at least one passageway 12 of the article 10. As used herein, "fluid connection" refers to a connection that allows the pressurized masking fluid 35 to pass from the pressure masker 30 to the passageway 12 with negligent loss to the outside environment. The fluid connection can comprise, for example, flexible tubes, hoses, pipes or any other conduit that directs the passage of the pressurized masking fluid 35 to the one or more passageways 12.

In one embodiment, such as that illustrated in FIG. 2, the fluid connection 31 may comprise a tube that directly connects the output of the pressure masker 30 to the first side 18 of the passageway 12. In some embodiments, the fluid connection 31 may comprise a single tube between the pressure masker 30 and a single passageway 12 (such as that illustrated in FIG. 2). In other embodiments, the fluid connection may comprise a single tube leaving the pressure masker 30 that breaks off into segments that connect to a plurality of passageways 12 (such as that illustrated in FIG. 1). In even other embodiments, the fluid connection 31 may comprise a plurality of tubes leaving the pressure masker 30 that connects to a single or a plurality of passageways 12. For example, the fluid connection 31 may comprise a plurality of channels of similar or dissimilar pressurized masking fluids 35 that connect to two or more passageways. Moreover, the plurality of channels may comprise different pressures, temperatures, directions or mixtures of pressurized masking fluids 35. It should be appreciated that any other configuration that provides a fluid connection 31 between the pressure masker 30 and one or more passageways 12 may alternatively or additionally be realized.

For example, referring now to FIG. 3, in some embodiments the fluid connection 31 may comprise a multi-outlet manifold connection 40 comprising an internal passage 41 that can receive pressurized masking fluid 35 from the pressure masker 30 and fluidly distribute it to one or more passageways. The multi-outlet manifold connection 40 can thereby attach directly to the first side 18 of the article 10 and distribute the pressurized masking fluid 35 to a wide area about the article 10. Any passageways 12 within that area will thereby have pressurized masking fluid 35 fluidly pass there through.

The pressurized masking fluid 35 can comprise any medium that can pass through the passageway 12 with a positive energy and prevent the permanent altering of a cross sectional area of the at least one passageway by the coating material 25 (or particulates thereof). As used herein, "prevent the permanent altering of a cross sectional area" (and variants thereof) refers to removing and/or preventing substantially all of the coating material 25 that may enter the passageway 12 so that the cross sectional area of the passageway is not substantially reduced by a permanent obstruction 32 or increased due to erosion, deformation or the like. It should be appreciated that a thin coating of the interior walls directly proximate the second side 19 of the coating material 25 is not considered to permanently alter the cross sectional area of the passageway 12 as any such reduction would be relatively minimal and not noticeably affect the flow of air through the passageway 12 during operation. Examples of obstructions that would permanently alter the cross sectional area of the passageway 12 include, for example, large particulates lodged against a wall, a clumping of coating material 25 or the like. The pressurized masking fluid 35 may thereby comprise any material that can be forced through the one or more passageways 12 at a masking pressure to impact on and remove potential obstructions 32 from the coating material 25 that would alter the cross sectional area.

For example, in some embodiments, the pressurized masking fluid 35 may comprise a gas such as inert gas or nitrogen. In some embodiments, the pressurized masking fluid 35 may comprise water with or without abrasives distributed therein. While specific embodiments of pressurized masking fluid 35 and part coaters have been presented herein, it should be appreciated that additional and alternative pressurized masking fluids and part coaters may also be realized. Moreover, the pressurized masking fluid 35 may comprise a masking pressure that is greater than, equal to, or less than a coating pressure of the coating material 25 so long as the pressurized masking fluid 35 has enough energy to remove obstructions 32 from the passageways 12. In some embodiments, the masking pressure may comprise a positive pressure such that the positive pressure pushes the pressurized masking fluid 35 through the passageway 12. In other embodiments, the masking pressure may comprise a negative pressure (such as via a vacuum or suction element on the second side 19 of the article 10 such that the negative pressure pulls the pressurized masking fluid 35 through the passageway 12. In some embodiments, the masking pressure may comprise a variable pressure that fluctuates during the masking process.

In operation, the pressure masker 30 thereby passes the pressurized masking fluid 35 through the at least one passageway 12 at a masking pressure from the first side 18 to the second side 19 (wherein the second side 19 comprises the target surface 11 of the article 10 that is to be coated). Likewise, the part coater coats the target surface 11 of the article 10 by projecting coating material 25 towards the target surface. As a result of flow pattern distributions, some of the coating material 25 may enter one or more passageways 12 and form one or more obstructions 32. For example, the obstructions 32 may comprise a grouping of particulates from the coating material that would decrease the cross sectional area of the passageway 12 and reduce the amount of air that could flow there through. However, to prevent the coating material 25 from permanently obstructing the at least one passageway 12 (and altering its cross sectional area), the pressurized masking fluid 35 will contact the obstruction 32 and push it back out of the passageway 12. In some embodiments, the pressurized masking fluid 35 may prevent any obstructions 32 from even entering the passageways 12 via the pressurized masking fluid 35 exiting the passageway 12 on the second side 19 of the article 10.

Referring now to FIGS. 1-4, a method 200 is illustrated for pressure coating a target surface 11 of an article 10 comprising one or more passageways 12. The method 200 first comprises fluidly connecting the pressure masker 30 to a first side 18 of at least one passageway 12 of the article 10 in step 210. As discussed above, the fluid connection 31 may comprise a variety of configurations and may connect any type of pressure masker 30 to any number of passageways 12. The pressure masker 30 then passes pressurized masking fluid 35 through the at least one passageway from the first side 18 to the second side 19 in step 220. Likewise, the part coater 20 coats the target surface 11 on the second side 19 of the article 10 by projecting coating material 25 towards the target surface 11 in step 230.

It should be appreciated that passing pressurized masking fluid 35 through the at least one passageway 12 in step 220 and coating the target surface 11 in step 230 may start and end simultaneously in or with relative delay. For example, in some embodiments the pressurized masking fluid 35 may be passing through the passageway 12 in step 20 prior to the initiation of coating the target surface 11 in step 230. Such embodiments may prevent a buildup of obstructions 32 prior to activation of the pressure masker 30. In some embodiments, the pressurized masking fluid 35 may continue to pass through the passageway 12 in step 220 after the article 10 is coated in step 230. Such embodiments may help ensure any obstacles 32 remaining in the passageways 12 after coating is complete in step 230 are still removed by the pressurized masking fluid 35.

It should now be appreciated that pressurized masking systems may be used to coat the target surface of an article while preventing the permanent altering of a cross sectional area of one or more passageways. The use of a fluid connection between the pressure masker and the one or more passageways can prevent the need for physical masking barriers such as tape, wax or the like potentially providing a more efficient coating system.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A pressurized masking system for coating a target surface of an article comprising passageways, the pressurized masking system comprising:
   a pressure masker that fluidly connects to a first side of at least one passageway of the article and passes a pressurized masking fluid through the passageway from the first side to a second side, wherein the second side comprises the target surface, wherein the fluid connection comprises a multi-outlet manifold connection element that attaches directly to the first side of the article and comprises an internal passage, wherein the internal passage receives the pressurized masking fluid and fluidly distributes it to one or more passageways; and, a part coater that projects a coating material towards the target surface, wherein the pressurized masking fluid prevents the coating material from permanently altering a cross sectional area of the at least one passageway.

2. The pressurized masking system of claim 1, wherein the pressurized masking fluid comprises a gas.

3. The pressurized masking system of claim 1, wherein the at least one passageway comprises a cooling hole.

4. The pressurized masking system of claim 1, wherein the pressurized masking fluid comprises a liquid.

5. The pressurized masking system of claim 1, wherein the coating material comprises MCrAlY, wherein M is Ni or Co.

6. The pressurized masking system of claim 1, wherein the coating material comprises yttria stabilized zirconia.

7. The pressurized masking system of claim 1, wherein the part coater comprises a thermal spray gun.

8. The pressurized masking system of claim 1, wherein the pressurized masking fluid passes through the at least one passageway at a masking pressure that is less than a coating pressure of the coating material.

9. The pressurized masking system of claim 1, wherein the article comprises a turbine component.

\* \* \* \* \*